United States Patent [19]

Suzuki et al.

[11] Patent Number: 4,522,660
[45] Date of Patent: Jun. 11, 1985

[54] PROCESS FOR ION NITRIDING OF ALUMINUM OR AN ALUMINUM ALLOY AND APPARATUS THEREFOR

[75] Inventors: Takatoshi Suzuki, Anjo; Hideo Tachikawa; Shigeo Moriyama, both of Aichi, all of Japan

[73] Assignee: Kubushiki Kaisha Toyota Chuo Kenkyusho, Japan

[21] Appl. No.: 501,001

[22] Filed: Jun. 3, 1983

[30] Foreign Application Priority Data

Jun. 4, 1982 [JP] Japan .................. 57-96836

[51] Int. Cl.³ .............................................. C21D 1/48
[52] U.S. Cl. .................. 148/20.3; 148/16.6; 204/177; 204/164; 266/251
[58] Field of Search .............. 148/20.3, 13, 437, 438, 148/439, 440, 16.6; 373/26; 204/177, 178, 164, 192 N; 266/250, 251, 252

[56] References Cited

U.S. PATENT DOCUMENTS

| | | | |
|---|---|---|---|
| 4,179,618 | 12/1979 | Tanaka et al. | 204/177 |
| 4,212,687 | 7/1980 | Tanaka et al. | 204/177 |
| 4,309,227 | 1/1982 | Kajikawa et al. | 148/20.3 |
| 4,342,918 | 8/1982 | Tanaka et al. | 373/26 |

FOREIGN PATENT DOCUMENTS 1435546  5/1976  United Kingdom ............... 266/252

OTHER PUBLICATIONS

Matsuda et al., "Surface Hardening of Non Ferrous Metals by Ion Nitriding", Japan Society for Heat Treatment, 16th Lecture Meeting, 3/26/83.
Handbook of Chemistry and Physics, 60th ed. 12/79.

Primary Examiner—L. Dewayne Rutledge
Assistant Examiner—S. Kastler
Attorney, Agent, or Firm—Berman, Aisenberg & Platt

[57] ABSTRACT

A process for ion nitriding of aluminum or an aluminum alloy and an apparatus therefor, wherein aluminum or an aluminum alloy as an article to be treated is disposed on a substrate holder provided in a sealed container. A predetermined metal having an intensive affinity for oxygen is also disposed in the vicinity of the article to be treated, and a glow discharge is operated between an electrode provided in the sealed container as an anode and the substrate holder as a cathode. The electrode may be directly provided at the sealed container itself or it may be independently provided therein. According to the process and apparatus of the present invention, it is possible to form on the surface of aluminum or an aluminum alloy an aluminum nitride layer having an intensive adhesion to a substrate thereof, high hardness and excellent wear resistance.

7 Claims, 8 Drawing Figures

4,522,660

PROCESS FOR ION NITRIDING OF ALUMINUM OR AN ALUMINUM ALLOY AND APPARATUS THEREFOR

BACKGROUND OF THE INVENTION

1. Field of the Invention

This invention relates to a process for ion nitriding of aluminum or an aluminum alloy and an apparatus therefor.

2. Description of the Prior Art

The surface treatment of aluminum or an aluminum alloy has been limited when compared with that of an iron group material. Practically speaking, only a method for producing a film coating of alumina by anodic oxidation treatment has been employed for this purpose. This alumina coating film, which is an anodic oxidation coating film of aluminum, has a Vickers hardness of about 200 to 600 depending upon treating conditions thereof, but the wear resistance is not necessarily sufficient for many uses.

There has recently been a demand for ion nitriding of aluminum or an aluminum alloy to provide a coating film having a hardness higher than the alumina coating film.

Ion nitriding of a ferrous alloy, generally has been carried out in such a manner that a gas inside a sealed container is replaced by a nitriding gas, and a glow discharge is operated between an anode, provided at the inner wall of the sealed container or independently provided therein, and the article to be treated which is used as the cathode to generate a nitrogen ion. It has been proposed to nitride the surface of aluminum or an aluminum alloy according to this technique.

Actually, however, when the article to be treated is aluminum or an aluminum alloy the surface thereof is oxidized so that it has not been possible to obtain a nitrided coating film of aluminum or an aluminum alloy having uniformity as well as durability. In this case, an impurity, such as alumina, residing on the surface of the article to be treated is physically removed therefrom before treatment by utilizing an ion sputtering phenomenon to purify the surface thereof. Such a cleaning has been conducted in the prior art many times.

The aforesaid cleaning method is effective to remove an oxide produced on the article before treatment, but it is not possible to prevent the article from being oxidized due to an extremely small amount of oxygen or oxidizing gas mixed with the nitriding gas during the treatment.

SUMMARY OF THE INVENTION

The inventors have found, in the course of a series of experiments, that proper adhesion of a nitride layer formed on the surface of aluminum is prevented by an extremely small amount of oxidizing gas in the treating atmosphere.

For the purpose of removing an impurity, such as an oxidizing gas, e.g., oxygen, water vapour, carbon dioxide or the like, from a nitriding gas, various gas normalization devices and cooling trap systems as well known may be employed to obtain a high quality nitriding gas. However, this case has the drawback that apparatus employed for this purpose is complex and expensive.

Accordingly, one object of the present invention is to improve the wear resistance of aluminum or an aluminum alloy.

Another object of the present invention is to form a coating film layer having a high hardness on the surface of aluminum or an aluminum alloy.

A further object of the present invention is to remove oxygen, or an oxidizing gas, from a nitriding gas, during ion nitriding.

A still further object of the present invention is to form an aluminum nitride layer by means of ion nitriding.

The present invention is directed to an improved ion-nitriding method, wherein a predetermined metal having an intensive affinity for oxygen is disposed adjacent to an article to be treated to absorb or catch an extremely small amount of oxidizing gas mixed with a nitriding gas by use of this intensive affinity. As a result, the article to be treated is not affected by the oxidizing gas, and an improved nitride coating layer is formed on the article.

More particularly, the process for ion nitriding of aluminum or an aluminum alloy according to the present invention is characterized by:

disposing an article to be treated on a substrate holder provided in a sealed container, which holder is to be used as a cathode;

replacing a gas inside of the aforesaid sealed container by a nitriding gas; and operating a glow discharge between an anode, which is provided at an inner wall of the aforesaid container or which is independently provided therein, and the aforesaid cathode; wherein:

the aforesaid article to be treated is an article made of aluminum or an aluminum alloy; and a predetermined metal having an intensive affinity for oxygen is provided in the aforesaid container adjacent the article to be treated.

According to the process of this invention, it is possible to form an aluminum nitride coating film layer having excellent adhesion as well as relative uniformity on the surface of aluminum or an aluminum alloy.

In addition, it is possible to reduce the amount of oxygen in a nitriding atmosphere during ion nitriding with ease by the use of an apparatus having a predetermined oxygen getter metal, one having an intensive affinity for oxygen, located at the substrate holder itself or in the vicinity thereof. The oxygen getter metal is disposed in such proximity to the article that said oxygen getter metal reacts with oxygen around said article and thus prevents the oxygen from being caught on the surface of the article. No other special device is required for this purpose.

Moreover, since an aluminum nitride coating film is formed on the surface of aluminum or an alloy thereof, it is possible to harden more the surface of aluminum or an aluminum alloy as a substrate and it is also possible to improve wear resistance thereof.

The apparatus for ion nitriding of aluminum or an aluminum alloy according to the present invention comprises a sealed container provided with an anode therein or provided with an inner wall a part of which is to be used as an anode; a substrate holder provided in the aforesaid container which is used as the cathode; and a predetermined metal disposed on the aforesaid substrate holder or adjacent thereto. The metal thus disposed has an intensive affinity for oxygen.

According to the present invention, when the predetermined metal, such as an oxygen getter metal, is provided on the substrate holder, or adjacent thereto, an amount of oxygen contained in a nitriding atmosphere inside of the sealed container under ion nitriding can be easily reduced, without employing any other special device.

In addition, it is possible to increase more the adhesion of the obtained aluminum nitride layer to aluminum or an aluminum alloy.

DESCRIPTION OF THE PREFERRED EMBODIMENTS

Figure 1:
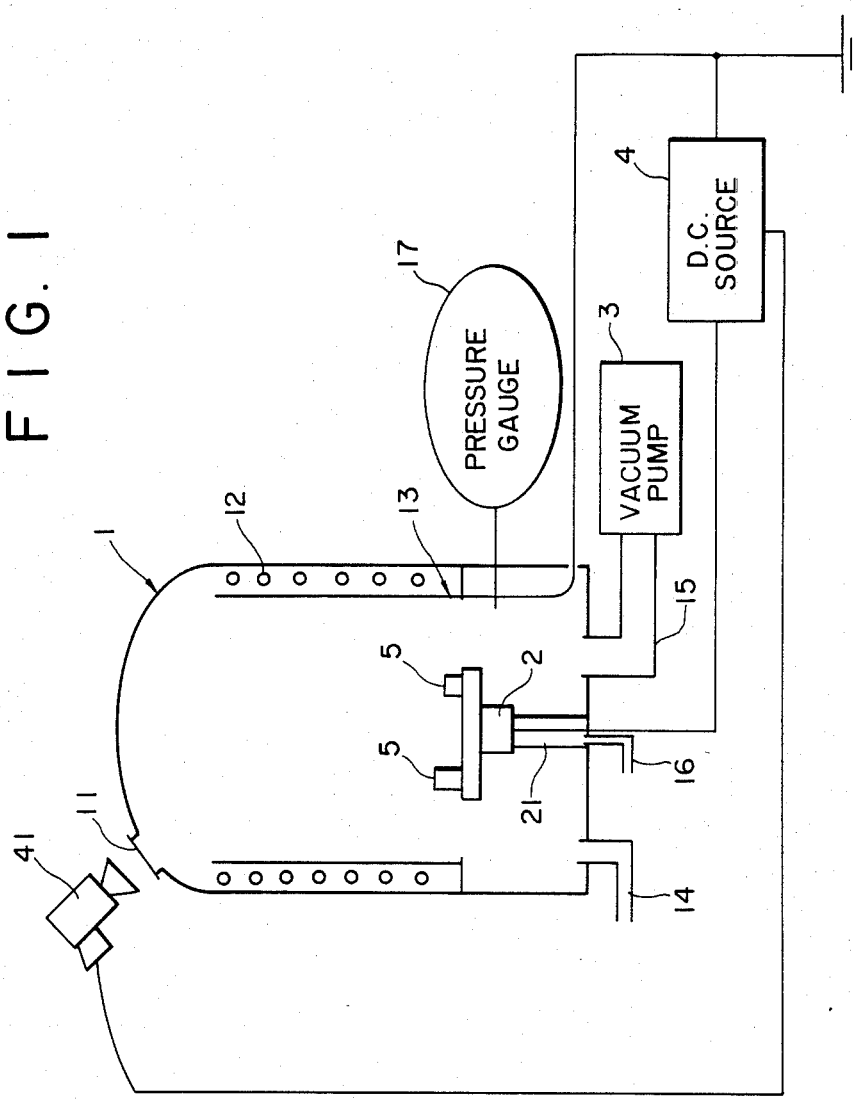
FIG. 1 is a schematic view illustrating an apparatus employed in EXAMPLE 1 according to the present invention.

A metal having an intensive affinity for oxygen is preferred in the present invention and alternatively is at least one metal element or an alloy thereof selected from group II a elements (such as beryllium, magnesium, calcium, strontium, barium and radium); group IIIa elements (such as scandium, yttrium, a lanthanum group element and an actinium group element); group IIIb elements (such as boron, aluminum, gallium, indium and thallium); group IVa elements (titanium, zirconium and hafnium); group Va elements (such as vanadium, niobium and tantalum) and group VIa elements (such as chromium, molybdenum and tungsten) of the Periodic table.

Preferred metal elements in practical use are aluminum, beryllium, magnesium, yttrium, titanium, zirconium, vanadium, niobium, chromium, molybdenum and tungsten. These metals react with oxygen mixed with a nitriding gas at the glow discharge to remove oxygen therefrom. Such metals serve as an oxygen getter in accordance with the present invention. Hereinafter, each of the aforesaid metals having an intensive affinity for oxygen will be merely called "an oxygen getter metal".

Preferably, the oxygen getter metal is disposed around the article to be treated as closely as possible. As a result, oxygen in the nitriding gas, particularly the oxygen ion, which is ionized to have an increased reaction, is made to collide with the oxygen getter metal and to be caught by the oxygen getter metal before it is allowed to collide with the article to be treated. In this case, however, the oxygen getter metal thus placed should not obstruct the article from being ion-nitrided by means of a glow discharge. For example, the substrate holder itself may be made of the oxygen getter metal, or the oxygen getter metal may be disposed around the article placed on the substrate holder.

The oxygen getter metal serves to catch oxygen on the surface thereof. For example, if the substrate holder is made of stainless steel, the surface thereof may be coated with chromium, which is one of the oxygen getter metals, by means of plating or the like for this purpose.

The oxygen getter metal will now be explained in more detail.

The oxygen getter metal preferably has an intensive affinity for oxygen and the ability to dissolve and solidify oxygen therein. Aluminum and chromium have an intensive affinity for oxygen, but they have a small solid solubility of oxygen. Therefore, if aluminum or chromium is used for the oxygen getter metal, only the surface thereof can serve as the oxygen getter, and the inside thereof cannot serve for this purpose. Consequently, in this case, the effect of the oxygen getter is lowered after a short time, and it must be replaced by a new oxygen getter metal to be used for this purpose.

On the other hand, titanium, zirconium, hafnium or vanadium has an affinity smaller than that of aluminum but the solid solubility of oxygen thereof is large. Therefore, such oxygen getter metals as these can continue to have an effect for the oxygen getter for a long time. However, the affinity thereof is poor so that the surface area of the oxygen getter must be increased to compensate for this poor affinity.

According to the process for ion nitriding and apparatus therefor in the present invention, it is possible to form an aluminum nitride coating layer having relative uniformity and good adhesion on the surface of aluminum or an aluminum alloy.

According to the present invention, the oxygen getter metal is provided at the substrate holder itself or is provided in the vicinity thereof, whereby oxygen contained in a nitriding atmosphere can be reduced without employing any other special device for this purpose. As a result, an aluminum nitride layer having excellent adhesion can be formed on the surface of aluminum or an aluminum alloy.

The aluminum nitride coating layer is a material which has been expected to have various uses in devices concerning electronics (such as an electroacoustic transducer, an insulated thin film or a luminous matter), or as a refractory material. The hardness thereof is about 1200 to 1600 in Vickers hardness. In addition, it has generally been said that aluminum nitride has an intensive covalent bonding property compared with oxide and is also very tough.

The present invention, which forms an aluminum nitride (AlN) layer having excellent adhesion on the surface of aluminum or an aluminum alloy, has an improved aluminum surface treatment.

In the present invention, it is preferable that an oxygen getter metal is made to coexist with an article to be treated to carry out sputtering thereto before the article is subjected to ion nitriding. As a result, the article to be treated can be purified and oxygen contained in the nitriding atmosphere can be caught by the oxygen getter metal.

Having generally described this invention, a further understanding can be obtained by reference to certain specific EXAMPLES which are provided herein for purpose of illustration only and are not intended to be limiting.

EXAMPLE 1

In this EXAMPLE, an ion nitriding apparatus, a schematic view of which is illustrated in FIG. 1, was employed. This apparatus comprised a sealed container 1 made of stainless steel, and a substrate holder 2 provided in the sealed container 1 at the center thereof as main constructional elements. In this case, the substrate holder 2 was made of titanium as an oxygen getter metal and it is an important feature of the apparatus according to this EXAMPLE 1. Other constructional elements thereof were almost the same as in the prior art.

The sealed container was provided with a lid 20 with a window 11 at an upper portion thereof and a heater 12 at the periphery of an inner side thereof. At an inner side of the heater 12, an anode plate 13 made of stainless steel was further provided. Moreover, the container 1 was provided with a gas introducing pipe 14 and a gas exhausting pipe 15 at predetermined portions of the bottom thereof. A cooling water pipe 16 for feeding cooling water into a stanchion 21 for the substrate holder 2 and a mercury manometer 17 (pressure gauge) were also provided.

The gas introducing pipe 14 communicated with a high-purity nitriding gas bomb (not shown) and a high-purity hydrogen gas bomb (not shown) through a control valve (not shown).

A vacuum pump 3 was attached to the gas exhausting pipe 15.

In the apparatus according to this EXAMPLE, a direct current power supply circuit 4 was connected to the anode 13 and the substrate holder 2 as the cathode. The direct current power supply circuit 4 received a signal from a two-color thermometer 41 which measured the temperature of the article to be treated through the window portion 11 and controlled the power supply circuit 4.

In this EXAMPLE, the article to be treated was industrial "pure aluminum 5" (containing more than 99.5% aluminum) in the form of a disc having an outer diameter of 19 mm and a thickness of 10 mm, and it was disposed on the substrate holder 2.

According to the ion nitriding of this EXAMPLE, employing the aforesaid apparatus, the pressure of a gas residing in the container 1 was reduced to $10^{-3}$ Torr by means of the vacuum pump 3. A wall portion of the container 1 (a furnace wall) was heated for 30 minutes by means of the heater 12 while the container was being evacuated. Immediately after heating, a hydrogen gas was introduced into the resulting container up to 4 Torr to replace the residing gas in the container by the hydrogen gas. Then, the pressure within the container was again reduced to $10^{-3}$ Torr. The replacement by hydrogen gas was repeated several times to reduce the oxygen gas residing in the container as much as possible.

Then, hydrogen gas was fed into the container (having a pressure reduced to $10^{-3}$ Torr) at a flow rate of 0.5 liters/min. The pressure of a flow meter at the inlet thereof was 1.5 atmospheres. At the same time, the pressure in the container was adjusted by evacuation so that it is maintained at 1.3 Torr. Then, a direct current voltage of several hundred volts was supplied between the anode 13 and the cathode 2 to operate a glow discharge, whereby sputtering was carried out to the article 5 to be treated which was disposed in the sealed container 1.

As a result, the surface of the article was purified, and oxygen in the atmosphere of the container was caught by the oxygen getter metal. After the temperature in the container increased because of the discharge, and the article was heated to 600° C., a nitriding gas was fed into the container in place of the hydrogen gas. The article was further heated to 650° C. in the container and was subjected to ion nitriding at 650° C. for 4 hours. After this ion nitriding, the article was released from the discharge and it was cooled under a reduced pressure ($\sim 10^{-3}$ Torr). After it was confirmed that a temperature of the article thus treated was decreased to less than 50° C., the article was taken out of the container.

In this ion nitriding, the average discharge voltage, the discharge current and the pressure of the nitriding gas, at the time when ion nitriding was carried out, were 520 volts, 0.5 ampere (A) and 6 Torr, respectively.

Figure 3:
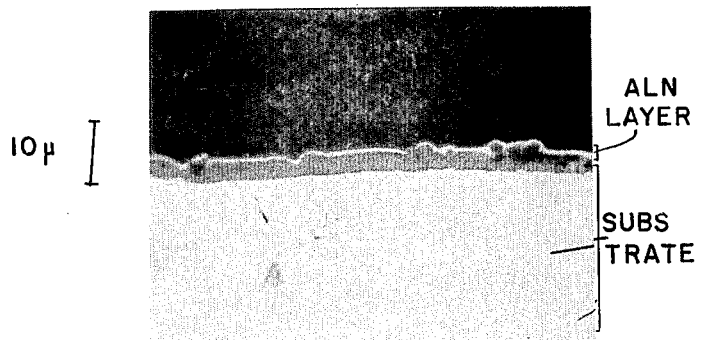
FIG. 3 is a photomicrograph showing a section of a coating layer formed on the treated article according to EXAMPLE 1.
Figure 4:
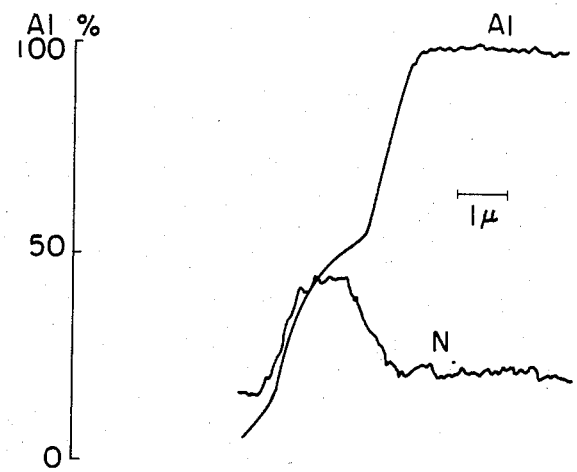
FIG. 4 is an electron probe microanalysis (EPMA) chart of aluminum and nitrogen components of the surface of a coating layer as shown in FIG. 3.
Figure 5:
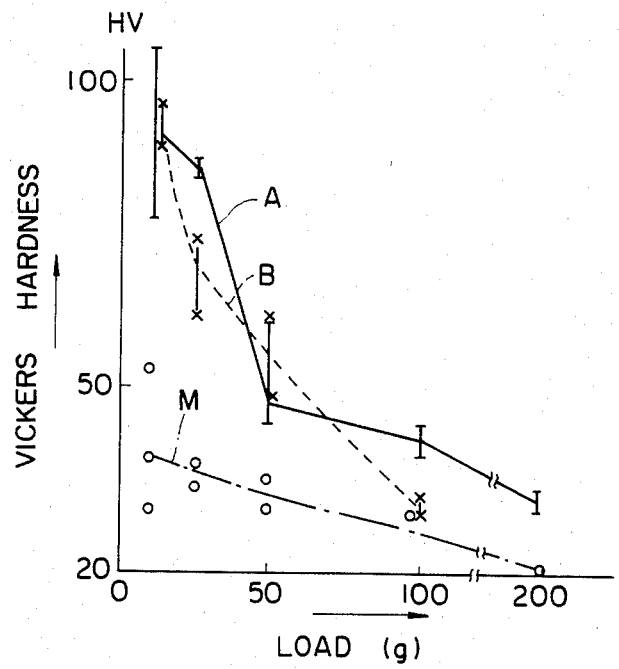
FIG. 5 is a graph showing the relation between a load to be applied to a Vickers hardness tester and the Vickers hardness of the layer.

The surface of the treated article obtained in this EXAMPLE was plated with gold and was thereafter cut. The section of the cut is shown in a photomicrograph in FIG. 3. In addition, an analized result of the section thereof with EPMA and Vickers hardness thereof measured from the surface thereof are shown in FIG. 4 and FIG. 5, respectively. It was confirmed from these Figures that the surface layer formed on the treated article was an aluminum nitride. In FIG. 5, a continuous line A represents hardness of the formed surface layer measured at the center portion thereof, a broken line B represents hardness thereof measured at the peripheral portion thereof and an alternate long and short dash line M represents hardness of a substrate of the article. In this case, however, it was difficult to measure hardness of only the coated surface layer, because the layer was thin. And therefore, it was supposed that the hardness of the layer thus measured included also hardness of the substrate. According to this EXAMPLE, an aluminum hitride layer having a thickness of about 3 to 5 microns was formed on the surface of aluminum as the article to be treated. In this layer, there was no inconvenience, such as spalling or breakaway thereof.

EXAMPLE 2

On the other hand, for comparison, the substrate holder 2 was made of iron, as in the prior art, and, except for the aforesaid substrate holder, in the same manner as in EXAMPLE 1, Ion nitriding was carried out on an article treated at a temperature of 650° C. for 4 hours. In this case, an average discharge voltage was 580 volts and a discharge current was 1.6 A. In the obtained aluminum nitride layer, there was observed spalling or breakaway over the entire surface thereof. As a result, it was not possible to obtain a satisfactory nitride layer.

Figure 6:
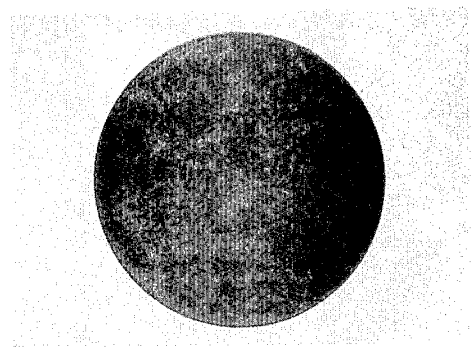
FIG. 6(a) is a photograph (about 2.5 ×) showing the surface of the coating layer according to EXAMPLE 1.
FIG. 6(b) is a photograph (about 2.5 ×) showing the surface of a comparative treated article.
Figure 6:
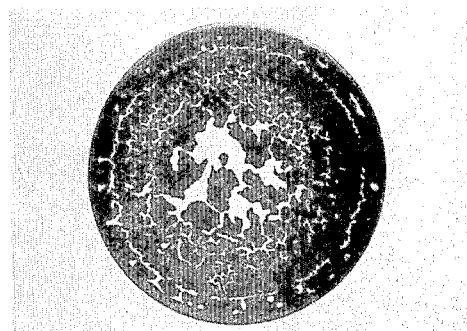

A photograph (2.5 ×) of the treated article according to EXAMPLE 1, in which a substrate holder made of titanium was employed for ion nitriding, is shown in FIG. 6(a). On the other hand, a photograph (2.5 ×) of the treated article for comparison, in which the substrate holder was made of iron as in EXAMPLE 2, is shown in FIG. 6(b). It is evident from these FIGS. 6(a) and 6(b) that in the case of the substrate holder made of titanium, aluminum nitride was formed over the entire surface of the treated article, but in the case of the substrate holder made of iron, the substrate (aluminum) as represented by white portions in FIG. 6(b) is exposed. As a result, there was observed spalling or breakaway of the layer.

EXAMPLE 3

A substrate holder 2 like that used in EXAMPLE 1 was made of industrial pure aluminum. In the same manner as in EXAMPLE 1, except for the aforesaid point, ion nitriding was carried out on an article to be treated. The glow discharge conditions in this case were 650° C., 4 hours, an average discharge voltage of 600 V and an average discharge current of 1.0 A. As a result, an aluminum nitride coating layer having a thickness of 3 microns was formed on the surface of the treated article. The coating layer thus formed was a uniform layer with no spalling in the same manner as in EXAMPLE 1.

EXAMPLE 4

Figure 7:
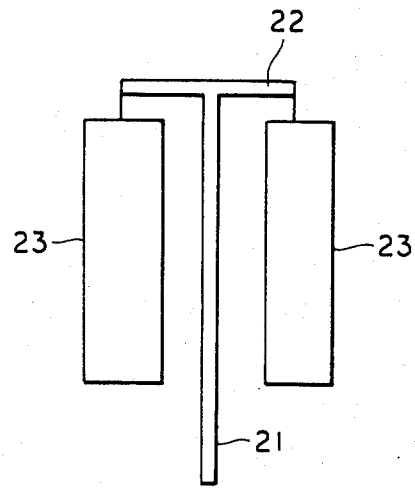
FIG. 7 is a schematic view of a substrate holder used in EXAMPLE 4 according to the present invention.

In place of the substrate holder 2 employed in EXAMPLE 1, another substrate holder as shown in FIG. 7 was employed. This substrate holder was provided with a center column 21 (50 cm in height), a cross girder 22 (26 cm in length) welded at the upper end portion of the center column 21, and baskets 23 made of wire cloth which were oppositely suspended from both side ends of the cross grider 22. Each of the opposite baskets 23 was divided into 10 steps in the longitudinal direction thereof to place the same article to be treated as in EXAMPLE 1 on each step. All of the substrate holder was made of carbon steel (S45C) with chromium plating on the entire surface of the substrate holder with a thickness of 10 microns.

Figure 2:
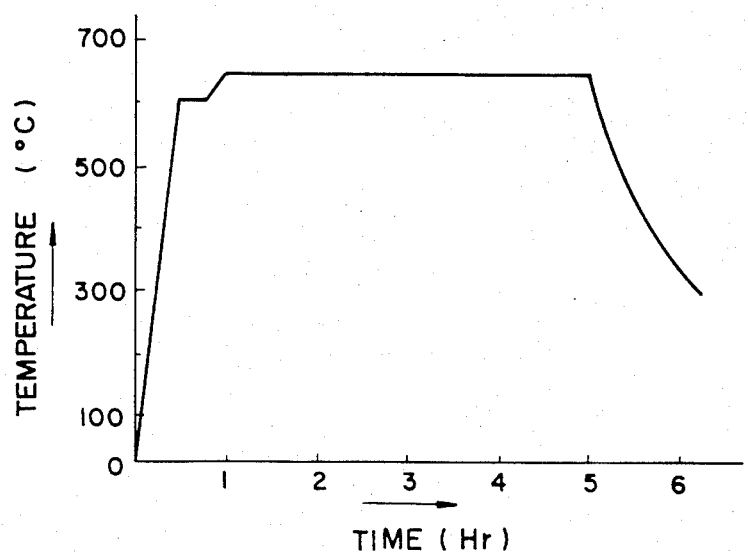
FIG. 2 is a graph illustrating a heat cycle in ion nitriding adopted in EXAMPLES 1 to 4.

In EXAMPLE 4, ion nitriding was also carried out to the article disposed in the aforesaid substrate holder with the same heat cycle as in FIG. 2. The treating conditions thereof were 650° C., 4 hours, an average discharge voltage of 800 V and an average discharge current of 3.0 A. There was uniformly formed on the surface of the treated article an aluminum nitride layer having a thickness of 3 to 5 microns.

What is claimed as new and intended to be covered by Letters Patent is:

1. A process for ion nitriding of aluminum or an aluminum alloy comprising the steps of:
   disposing aluminum or an aluminum alloy as an article to be treated on a substrate holder provided in a sealed container and disposing an oxygen getter metal having an intensive affinity for oxygen in such proximity to said article that said oxygen getter metal may react with oxygen around said article to prevent said oxygen from being caught on the surface of said article, said oxygen getter metal being at least one metal selected from the group consisting of a group IIa element, a group IIIa element, a group IIIb element, a group IVa element, a group Va element and a group VIa element of the Periodic table, or an alloy of at least one such metal;
   replacing gas in said sealed container by a nitriding gas, oxygen and oxidizing gas remaining in said nitriding gas being caught by said oxygen getter metal; and
   creating a glow discharge between an electrode provided in said sealed container, which is used as an anode, and the substrate holder, which is used as a cathode, thereby forming an aluminum nitride layer on the surface of said article without the effect of oxygen or oxidizing gas in the nitriding gas.

2. A process according to claim 1, wherein said oxygen getter metal is aluminum, magnesium, beryllium, yttrium, titanium, niobium, zirconium, vanadium, molybdenum, tungsten or chromium.

3. A process according to claim 1, wherein said oxygen getter metal is disposed on said substrate holder.

4. A process according to claim 1, wherein said oxygen getter metal is coated on the surface of said substrate holder.

5. A process according to claim 1, wherein said substrate holder itself is made of said oxygen getter metal.

6. An apparatus for ion nitriding of aluminum or an aluminum alloy comprising:
   a sealed container;
   a substrate holder provided in said sealed container, for disposing said aluminum or an aluminum alloy as an article to be treated thereon; and
   an oxygen getter metal having an intensive affinity for oxygen and in such proximity to the article to prevent oxygen from being caught on the surface of said article, said oxygen getter metal being at least one metal selected from the group consisting of a group IIa element, a group IIIa element, a group IIIb element, a group IVa element, a group Va element and a group VIa element of the Periodic table, or an alloy of at least one such metal;
   the sealed container being provided with an electrode which is used as an anode, said electrode being a part of the sealed container or a separate element, and
   said substrate holder being used as a cathode to effect a glow discharge and comprising a center column and baskets for supporting said article, said baskets being suspended from a cross grinder secured to an upper end portion of said center column.

7. A method of using an oxygen getter metal to form an aluminum nitride coating film surface layer, having excellent adhesion as well as relative uniformity, on aluminum or an aluminum alloy which comprises ion-nitriding the aluminum or aluminum alloy in a substantially oxygen-free atmosphere in a sealed container with the oxygen getter metal, said oxygen getter metal being disposed in such proximity to said aluminum or aluminum alloy to enable it to react with oxygen around said aluminum or aluminum alloy to prevent said oxygen from being caught on the surface thereof.

* * * * *